(12) United States Patent
Ito et al.

(10) Patent No.: US 10,553,778 B2
(45) Date of Patent: Feb. 4, 2020

(54) PIEZOELECTRIC DEVICE AND METHOD FOR MANUFACTURING PIEZOELECTRIC DEVICE

(71) Applicant: Murata Manufacturing Co., Ltd., Nagaokakyo-shi, Kyoto-fu (JP)

(72) Inventors: Korekiyo Ito, Nagakakyo (JP); Takashi Iwamoto, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 293 days.

(21) Appl. No.: 15/348,129

(22) Filed: Nov. 10, 2016

(65) Prior Publication Data

US 2017/0062698 A1  Mar. 2, 2017

Related U.S. Application Data

(60) Division of application No. 14/028,621, filed on Sep. 17, 2013, now Pat. No. 9,537,079, which is a
(Continued)

(30) Foreign Application Priority Data

Mar. 22, 2011 (JP) .................................. 2011-062315

(51) Int. Cl.
*H01L 41/29* (2013.01)
*H01L 41/313* (2013.01)
(Continued)

(52) U.S. Cl.
CPC .............. *H01L 41/29* (2013.01); *H01L 41/04* (2013.01); *H01L 41/0477* (2013.01);
(Continued)

(58) Field of Classification Search
CPC ..... Y10T 29/42; Y10T 29/49005; H03H 3/02; H03H 3/08; H03H 9/0253; H03H 9/02559;
(Continued)

(56) References Cited

U.S. PATENT DOCUMENTS

2002/0008437 A1 *  1/2002  Inoue ....................... H03H 3/08
                                                                    310/313 A
2010/0088868 A1 *  4/2010  Kando .................. H01L 41/257
                                                                    29/25.35

FOREIGN PATENT DOCUMENTS

WO    WO 2009081651 A1 *  7/2009 ........... H01L 41/257

OTHER PUBLICATIONS

Solal, M. et. al., "Oriented Lithium Niobate Layers Transferred on 4" (100) Silicon Wafer for RF SAW Devices, 2002, IEEE Ultrasonics Symposium, Jan. 1, 2002, pp. 131-134 (Year: 2002).*
(Continued)

*Primary Examiner* — Peter Dungba Vo
*Assistant Examiner* — Joshua D Anderson
(74) *Attorney, Agent, or Firm* — Keating & Bennett, LLP

(57) ABSTRACT

In a method of manufacturing a piezoelectric device, among a +C plane on a +Z axis side of a piezoelectric thin film and a −C plane on a −Z axis side of the piezoelectric thin film, the −C plane on the −Z axis side of the piezoelectric thin film is etched. Thus, −Z planes of the piezoelectric thin film on which epitaxial growth is possible are exposed. Ti is epitaxially grown on the −Z planes of the piezoelectric thin film in the −Z axis direction such that the crystal growth plane thereof is parallel to the −Z planes of the piezoelectric thin film. Al is then epitaxially grown on the surface of the Ti electrode in the −Z axis direction such that the crystal growth plane thereof is parallel to the −Z planes of the piezoelectric thin film.

8 Claims, 12 Drawing Sheets

Related U.S. Application Data continuation of application No. PCT/JP2012/057119, filed on Mar. 21, 2012.

(51) Int. Cl.

| | | |
|---|---|---|
| *H03H 3/08* | (2006.01) | |
| *H01L 41/187* | (2006.01) | |
| *H03H 9/02* | (2006.01) | |
| *H03H 9/145* | (2006.01) | |
| *H01L 41/04* | (2006.01) | |
| *H01L 41/047* | (2006.01) | |
| *H01L 41/297* | (2013.01) | |

(52) U.S. Cl.
CPC ........ *H01L 41/1873* (2013.01); *H01L 41/297* (2013.01); *H01L 41/313* (2013.01); *H03H 3/08* (2013.01); *H03H 9/02574* (2013.01); *H03H 9/02929* (2013.01); *H03H 9/14538* (2013.01); *Y10T 29/42* (2015.01); *Y10T 29/49005* (2015.01)

(58) Field of Classification Search
CPC ........... H03H 9/02574; H03H 9/02622; H03H 9/02929; H03H 9/14538; H01L 41/04; H01L 41/0477; H01L 41/322; H01L 41/1873; H01L 41/29; H01L 41/297; H01L 41/313
See application file for complete search history.

(56) References Cited

OTHER PUBLICATIONS

Ito et al., "Piezoelectric Device", U.S. Appl. No. 14/028,621, filed Sep. 17, 2013.

* cited by examiner (S101)

(S102)

(S103)

(S104)

(S105、S106)

(S107)

(S108)

(S110)

(S111)

(S112,S113)

(S201)

(S202)

(S203)

(S204, S205)

(S207)

(S208)

(S209, S210)

PIEZOELECTRIC DEVICE AND METHOD FOR MANUFACTURING PIEZOELECTRIC DEVICE

BACKGROUND OF THE INVENTION

1. Field of the Invention

The present invention relates to piezoelectric devices including a piezoelectric thin film and methods for manufacturing such piezoelectric devices.

2. Description of the Related Art

Piezoelectric devices including a piezoelectric thin film are currently being developed. A plurality of methods for manufacturing a piezoelectric thin film are available to form such piezoelectric devices. For example, as disclosed in Japanese Unexamined Patent Application Publication No. 2002-534886, a method for manufacturing a piezoelectric device is developed in which a piezoelectric thin film is split off from a piezoelectric substrate along an ion-implanted layer.

The method for manufacturing a piezoelectric device in which a piezoelectric thin film is split off from a piezoelectric substrate along an ion-implanted layer will now be described.

FIG. 1 is a series of sectional views schematically showing a process for manufacturing a piezoelectric device in Japanese Unexamined Patent Application Publication No. 2002-534886. Referring first to FIG. 1A, hydrogen ions are implanted into a surface 7 of a piezoelectric substrate 5 to form an ion-implanted layer 6 at a predetermined depth d in the piezoelectric substrate 5. Referring now to FIG. 1B, a bonding material 8 is deposited on the surface 7 of the piezoelectric substrate 5 by sputtering. Referring now to FIG. 1C, a support substrate 9 is bonded to the piezoelectric substrate 5. Finally, the stack of the piezoelectric substrate 5 and the support substrate 9 is heated to split the piezoelectric substrate 5 along the ion-implanted layer 6. As a result, a piezoelectric thin film 4 shown in FIG. 1D is formed on the support substrate 9. In the method of manufacture in Japanese Unexamined Patent Application Publication No. 2002-534886, the split surface of the piezoelectric thin film 4 is planarized by polishing.

Thereafter, electrodes are formed on the piezoelectric thin film 4 shown in FIG. 1D to obtain a piezoelectric device such as an SAW device. The bonding material 8 is, for example, $SiO_2$ or a metal material (such as Cu, Ti, or Al).

Al and Al alloys based on Al, which have low electrical resistivity and low specific gravity, are commonly used as electrode materials for piezoelectric devices. Al electrodes, however, have poor stress migration resistance; a high electric power supplied to Al electrodes causes a hillock or void in the Al electrodes and finally shorts or breaks the Al electrodes, thus damaging the piezoelectric device.

To solve this problem, for example, Japanese Unexamined Patent Application Publication No. 2002-305425 discloses a method for forming an Al electrode with improved power durability etching a surface of a piezoelectric substrate 2 and then epitaxially growing Al on the piezoelectric substrate 2. Specifically, a several-nm-thick damaged layer 3 (see FIG. 2A) formed on the surface of the piezoelectric substrate 2 by, for example, polishing is initially etched with a strong acid such as hydrofluoric acid to expose crystal planes 14 on the +Z axis side of the piezoelectric substrate 2 on which epitaxial growth is possible. As shown in FIG. 2B, after the removal of the damaged layer 3 by etching, an extremely fine stepped structure is exposed in the surface of the piezoelectric substrate 2. This structure has flat surfaces formed by the crystal planes 14 on the +Z axis side of the piezoelectric substrate 2 (hereinafter abbreviated as "+Z planes 14") perpendicular to the +Z axis, which is a crystal axis. Al is then epitaxially grown on the +Z planes 14 of the piezoelectric substrate 2 in the +Z axis direction such that the crystal growth plane thereof is parallel to the +Z planes 14. Thus, as shown in FIG. 2C, an Al electrode 11 whose crystal orientation is aligned in the +Z axis direction of the piezoelectric substrate 2 is formed on the piezoelectric substrate 2, which improves the power durability of the Al electrode.

The method in Japanese Unexamined Patent Application Publication No. 2002-305425 above, however, has the problem of an extremely low etching rate in the +Y axis direction of the piezoelectric substrate 2. If the piezoelectric thin film 4 shown in FIG. 1D is used to provide a high-performance piezoelectric device with improved power durability, the etchant concentration or the etching time needs to be increased to expose the +Z planes of the piezoelectric thin film 4 on which epitaxial growth is possible. Increasing the etchant concentration or the etching time, however, causes a problem in that the bonding material 8 between the piezoelectric thin film 4 and the support substrate 9 dissolves in the strong acid.

SUMMARY OF THE INVENTION

Accordingly, preferred embodiments of the present invention provide a piezoelectric device that improves the power durability of an electrode disposed on a piezoelectric thin film and a significant reduction in etchant concentration or etching time, and also to provide a method for manufacturing such a piezoelectric device.

A piezoelectric device according to a preferred embodiment of the present invention includes a support; a piezoelectric thin film located on or over the support and polarized along a +Z axis and a −Z axis that are crystal axes; and an electrode located on a crystal plane of the piezoelectric thin film perpendicular to the −Z axis and having a crystal plane parallel to the crystal plane of the piezoelectric thin film.

The piezoelectric device preferably further includes a dielectric film between the support and the piezoelectric thin film.

The electrode in this structure has superior power durability because the crystal orientation thereof is aligned in the −Z axis direction.

In this structure, during manufacture, the crystal plane of the piezoelectric thin film, on which epitaxial growth is possible, is exposed by etching the main surface on the −Z axis side of the piezoelectric thin film. The etching rate in the −Y axis direction of the piezoelectric thin film is extremely higher than the etching rate in the +Y axis direction of the piezoelectric thin film. This allows for a significant reduction in the etchant concentration or etching time to expose the crystal plane of the piezoelectric thin film on which epitaxial growth is possible. Thus, if the dielectric film is provided between the piezoelectric thin film and the support, the amount of dielectric film etched during etching can be significantly reduced.

Thus, this structure allows for an improvement in the power durability of the electrode located on the piezoelectric thin film and a significant reduction in etchant concentration or etching time during manufacture.

The electrode material is preferably aluminum or an aluminum-based material, for example.

The electrode is preferably arranged on the crystal plane of the piezoelectric thin film such that a (111) crystal plane of the aluminum is parallel to the −Z plane of the piezoelectric thin film.

The piezoelectric thin film preferably includes single-crystal lithium niobate or single-crystal lithium tantalite, for example. Such a piezoelectric thin film is spontaneously polarized along the +Z axis and the −Z axis.

A method for manufacturing a piezoelectric device according to another preferred embodiment of the present invention includes the following steps. The present preferred embodiment of the present invention relates to a method for manufacturing a piezoelectric device including a support and a piezoelectric thin film formed on or over the support and polarized along a +Z axis and a −Z axis that are crystal axes.

The method for manufacturing a piezoelectric device according to a preferred embodiment of the present invention includes at least an etching step and an electrode-forming step. The etching step involves, among a main surface on the +Z axis side of the piezoelectric thin film and a main surface on the −Z axis side of the piezoelectric thin film, etching the main surface on the −Z axis side of the piezoelectric thin film. The electrode-forming step involves forming an electrode by epitaxially growing an electrode material on a crystal plane, exposed by the etching, of the piezoelectric thin film perpendicular to the −Z axis in the −Z axis direction such that a crystal growth plane thereof is parallel to the crystal plane of the piezoelectric thin film.

In this method of manufacture, the crystal plane of the piezoelectric thin film on which epitaxial growth is possible is exposed by etching the main surface on the −Z axis side of the piezoelectric thin film. The etching rate in the −Y axis direction of the piezoelectric thin film is extremely higher than the etching rate in the +Y axis direction of the piezoelectric thin film. This allows for a significant reduction in the etchant concentration or etching time to expose the crystal plane of the piezoelectric thin film on which epitaxial growth is possible. Thus, if the dielectric film is provided between the piezoelectric thin film and the support, the amount of dielectric film etched during etching is significantly reduced.

The electrode formed by the electrode-forming step has superior power durability because the electrode is formed on the crystal plane of the piezoelectric thin film such that the crystal orientation thereof is aligned in the −Z axis direction of the piezoelectric thin film.

Thus, this method of manufacture provides an improvement in the power durability of the electrode formed on the piezoelectric thin film and a significant reduction in etchant concentration or etching time.

The electrode material is preferably aluminum or an aluminum-based material, for example.

The electrode is formed in the electrode-forming step by epitaxially growing the aluminum on the crystal plane of the piezoelectric thin film in the −Z axis direction such that a (111) crystal growth plane of the aluminum is parallel to the crystal plane of the piezoelectric thin film.

The piezoelectric thin film is preferably formed of single-crystal lithium niobate or single-crystal lithium tantalite, for example.

The method for manufacturing a piezoelectric device according to a preferred embodiment of the present invention further includes at least an ion implantation step and a splitting step. The ion implantation step involves implanting an ionized element into a single-crystal piezoelectric substrate to form a region in which the concentration of the element implanted into the single-crystal piezoelectric substrate peaks. The splitting step involves splitting off the piezoelectric thin film from the single-crystal piezoelectric substrate along the region in which the concentration of the implanted element peaks.

In this method of manufacture, a single-crystal thin film is preferably formed by ion implantation and splitting. This method of manufacture therefore allows the formation of a piezoelectric thin film having a higher piezoelectricity than a polycrystalline thin film deposited by, for example, sputtering, evaporation, or CVD.

The single-crystal piezoelectric substrate is preferably a rotated Y-cut substrate, for example.

The single-crystal piezoelectric substrate preferably has a cut angle of more than 90° and less than 270° (i.e., more than −270° and less than −90°).

Accordingly, various preferred embodiments of the present invention improves the power durability of an electrode formed on a piezoelectric thin film and a significant reduction in etchant concentration or etching time.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

A method for manufacturing a piezoelectric device according to a first preferred embodiment of the present invention will now be described with reference to FIGS. 3 to 7. As the method for manufacturing a piezoelectric device, a method for manufacturing a surface acoustic wave device will be described below by way of example.

Figure 1A:
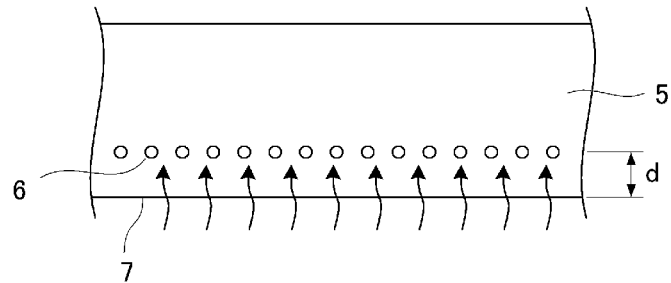
FIGS. 1A to 1D are sectional views schematically showing a process for manufacturing a piezoelectric device in Japanese Unexamined Patent Application Publication No. 2002-534886.
Figure 1B:
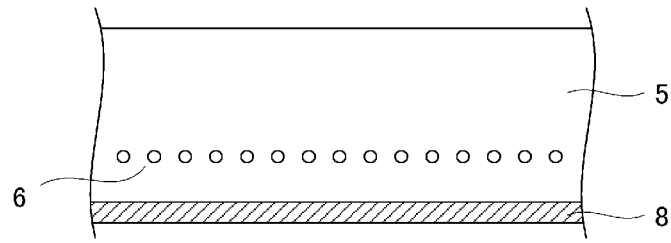
Figure 1C:
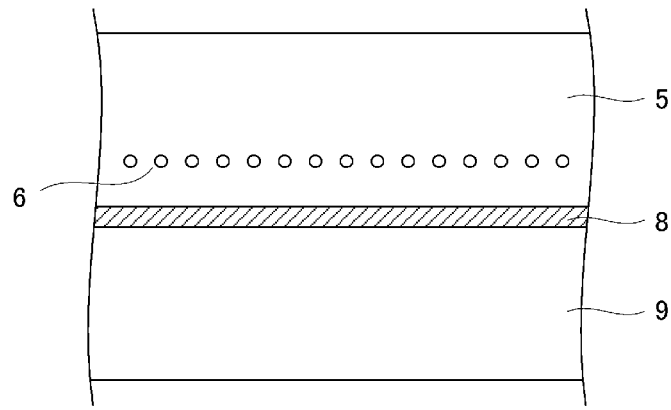
Figure 1D:
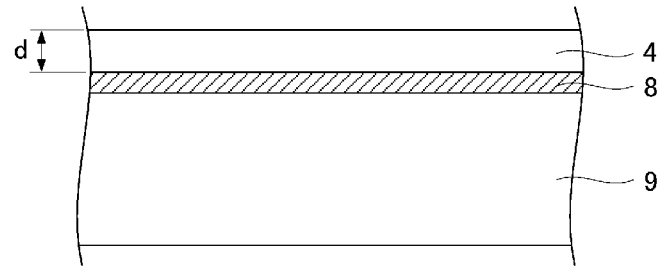
Figure 2A:
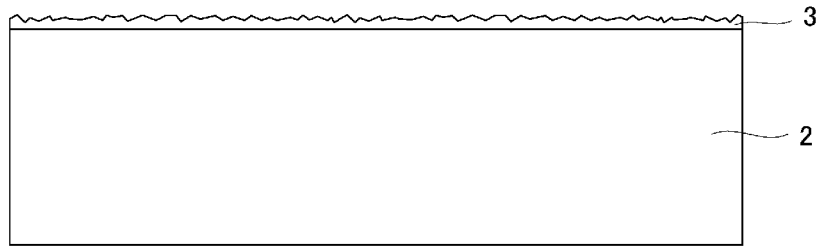
FIG. 2A is a sectional view schematically showing a polished surface of a piezoelectric substrate 2 used in a method for manufacturing a piezoelectric device in Japanese Unexamined Patent Application Publication No. 2002-305425.
Figure 2B:
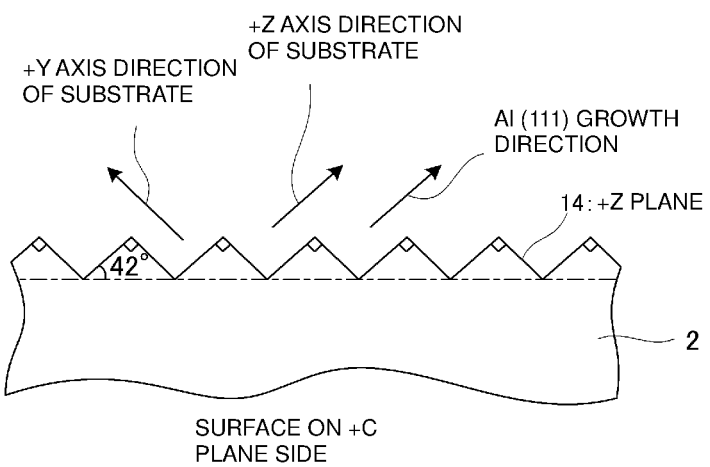
FIG. 2B a sectional view schematically showing a stepped structure on the +C plane side of the piezoelectric substrate 2 exposed after the completion of an etching step.
Figure 2C:
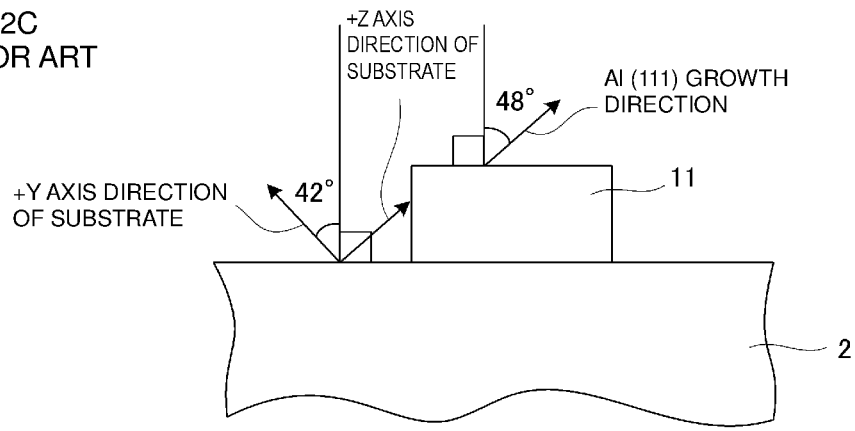
FIG. 2C a sectional view schematically showing an Al electrode 11 epitaxially grown on +Z planes of the piezoelectric substrate 2 by an electrode-forming step.
Figure 3:
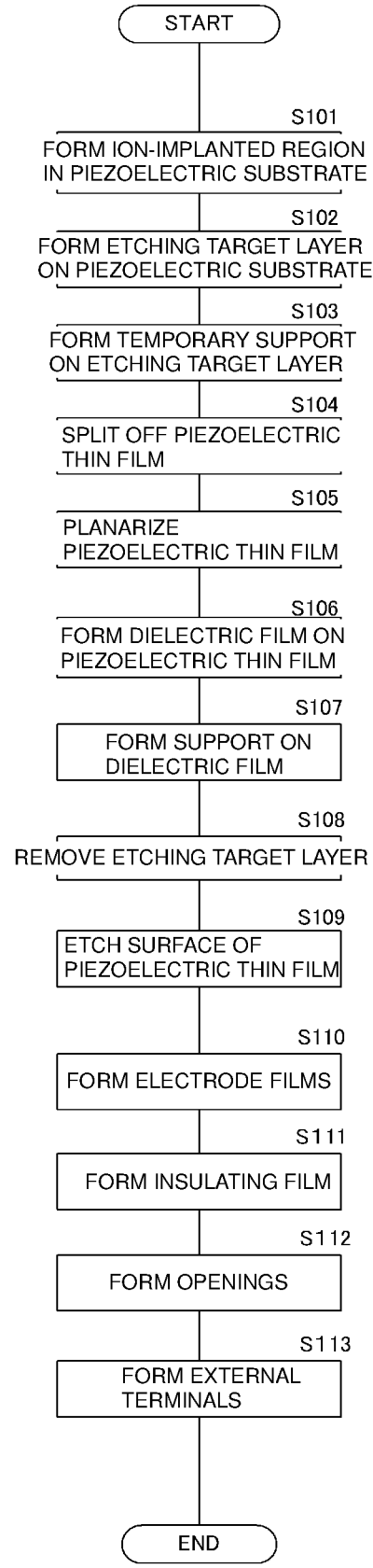
FIG. 3 is a flowchart showing an example of a method for manufacturing a piezoelectric device according to a first preferred embodiment of the present invention.

FIG. 3 is a flowchart showing the method for manufacturing a piezoelectric device according to the first preferred embodiment. FIGS. 4A-4C, 5A-5D, and 7A-7C are sectional views schematically showing the process for manufacturing a piezoelectric device shown in FIG. 3. FIG. 6A is a sectional view schematically showing a stepped structure on the −C plane side of a piezoelectric thin film 20 exposed after the completion of an etching step shown at S109 in FIG. 3. FIG. 6B is a sectional view schematically showing electrodes 60A to 60C epitaxially grown on −Z planes of the piezoelectric thin film 20 by an electrode-forming step shown at S110 in FIG. 3.

Figure 4A:
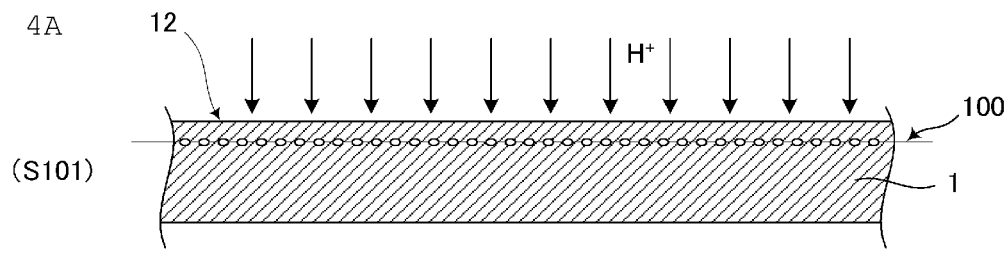
FIGS. 4A to 4C are sectional views schematically showing the process for manufacturing a piezoelectric device shown in FIG. 3.
Figure 4B:
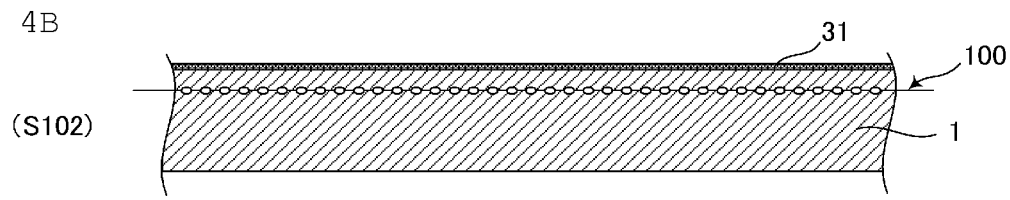
Figure 4C:
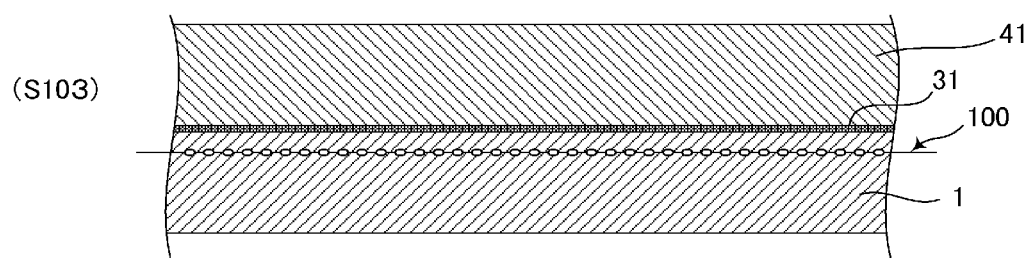

Referring first to FIGS. 4A-4C, a single-crystal piezoelectric substrate 1 having a predetermined thickness is provided. In this preferred embodiment, the single-crystal piezoelectric substrate 1 preferably is a 42° Y-X cut lithium tantalate substrate, for example. Therefore, the Y axis direction and the Z axis direction of the crystal of the single-crystal piezoelectric substrate 1 are oriented in the directions indicated by the respective arrows in FIGS. 6A and 6B. The X axis direction is perpendicular to the page. The single-crystal piezoelectric substrate 1 is spontaneously polarized along the +Z axis and the −Z axis, which are crystal axes. A −C plane 12 of the piezoelectric thin film 20 (single-crystal piezoelectric substrate 1) shown in FIGS. 4A-4C and 6A is a main surface on the −Z axis side of the piezoelectric thin film 20 (single-crystal piezoelectric substrate 1). A +C plane 22 of the piezoelectric thin film 20 shown in FIGS. 5A-5D is a main surface on the +Z axis side of the piezoelectric thin film 20. −Z planes 21 of the piezoelectric thin film 20 shown in FIG. 6A are crystal planes of the piezoelectric thin film 20 perpendicular to the −Z axis. +Z planes of the piezoelectric thin film 20 are crystal planes of the piezoelectric thin film 20 perpendicular to the +Z axis.

Instead of a lithium tantalate substrate, the single-crystal piezoelectric substrate 1 may be a lithium niobate substrate, a lithium tetraborate substrate, a langasite substrate, or a potassium niobate substrate, for example.

Hydrogen ions are then implanted into the −C plane 12 of the single-crystal piezoelectric substrate 1 to form an ion-implanted region 100 in the single-crystal piezoelectric substrate 1 (S101 in FIGS. 3 and 4A). For example, if the single-crystal piezoelectric substrate 1 is a lithium tantalate substrate, hydrogen ions are implanted at a dose of about $1.0 \times 10^{17}$ atoms/cm$^2$ with an acceleration energy of about 150 keV to form the ion-implanted region 100 at a depth of about 1 μm from the −C plane 12. The ion-implanted region 100 is a region in which the concentration of the ion element implanted into the single-crystal piezoelectric substrate 1 peaks.

If the single-crystal piezoelectric substrate 1 is a substrate other than a lithium tantalate substrate, ion implantation is performed under the conditions depending on the particular substrate.

An etching-target-layer forming step is then performed to form an etching target layer 31 on the −C plane 12 of the single-crystal piezoelectric substrate 1 (S102 in FIGS. 3 and 4B). The etching target layer 31 may be formed of a material that can be etched with sufficient selectivity relative to the piezoelectric thin film 20 and a support layer in a temporary-support-substrate removing step, for example, an inorganic material such as ZnO, SiO$_2$, or AlN, a metal material such as Cu, Al, or Ti, an organic material such as polyimide, or a multilayer film thereof.

The etching target layer 31 may be omitted.

A temporary-support forming step is then performed to form a temporary support 41 on the etching target layer 31 formed on the single-crystal piezoelectric substrate 1 (S103 in FIGS. 3 and 4C). The temporary support 41 and the etching target layer constitute a temporary support substrate. The temporary support substrate composed of the etching target layer 31 and the temporary support 41 is not limited to any particular material, although the material selected may be one that exerts a smaller thermal stress on the interface with the single-crystal piezoelectric substrate 1 (piezoelectric thin film 20) than a support 51, preferably a sufficiently small thermal stress not to cause a problem.

At S103, the preliminary support 41 is composed of the same type of lithium tantalate substrate as the single-crystal piezoelectric substrate 1, and the etching target layer 31 is composed of a Cu film and a SiO$_2$ film deposited by sputtering. Thus, the preliminary support 41 itself has the same coefficient of linear expansion as the single-crystal piezoelectric substrate itself does. This results in a sufficiently small thermal stress not to cause a problem being exerted on the interface between the temporary support substrate, which is composed of the etching target layer 31 and the temporary support 41, and the single-crystal piezoelectric substrate 1 (piezoelectric thin film 20).

Although the etching target layer 31 has a different coefficient of linear expansion from a lithium tantalate substrate, the thermal stress on the interface with the single-crystal piezoelectric substrate 1 (piezoelectric thin film 20) can be reduced by directly depositing a highly ductile material (e.g., a metal material), such as the above Cu film, on the single-crystal piezoelectric substrate 1 and reducing the thickness of the etching target layer 31 to the minimum necessary thickness.

Figure 5A:
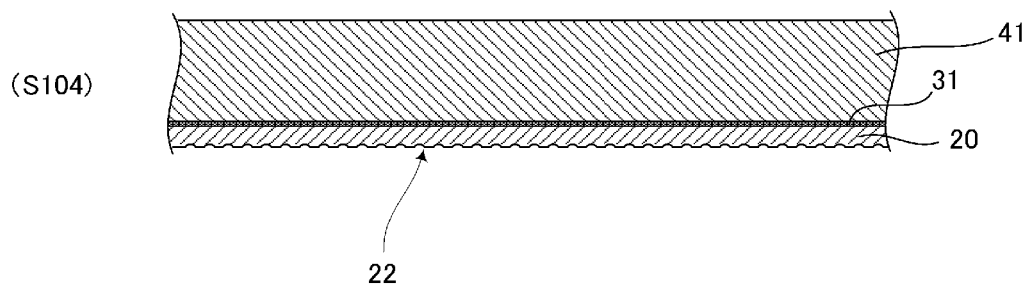
FIGS. 5A to 5D are sectional views schematically showing the process for manufacturing a piezoelectric device shown in FIG. 3.
Figure 6A:
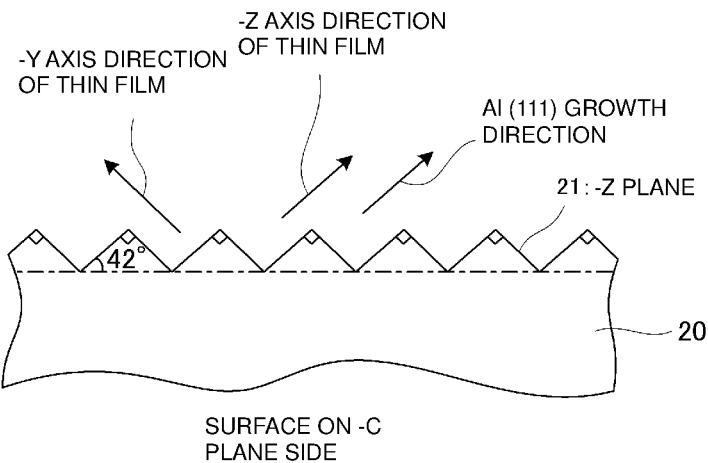
FIG. 6A is a sectional view schematically showing a stepped structure on the −C plane side of a piezoelectric thin film 20 exposed after the completion of an etching step shown at S109 in FIG. 3.
Figure 6B:
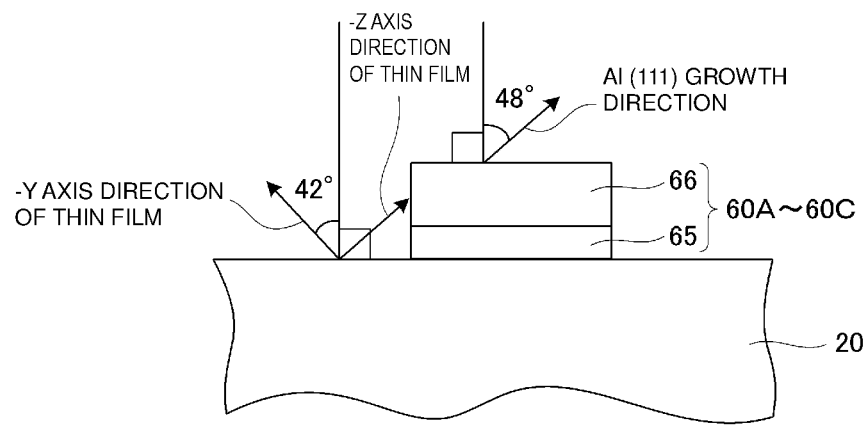
FIG. 6B is a sectional view schematically showing electrodes 60A to 60C epitaxially grown on −Z planes of the piezoelectric thin film 20 by an electrode-forming step shown at S110 in FIG. 3.

After S103, the single-crystal piezoelectric substrate 1 is heated to split the single-crystal piezoelectric substrate 1 along the ion-implanted region 100, in which the concentration of the element implanted into the piezoelectric substrate 1 peaks (S104 in FIGS. 3 and 5A). By this step, the temporary support substrate having the single-crystal piezoelectric thin film 20 formed thereon is obtained.

The heating temperature in the splitting step at S104 can be lowered if the single-crystal piezoelectric substrate 1 is heated in a reduced-pressure atmosphere.

Figure 5B:
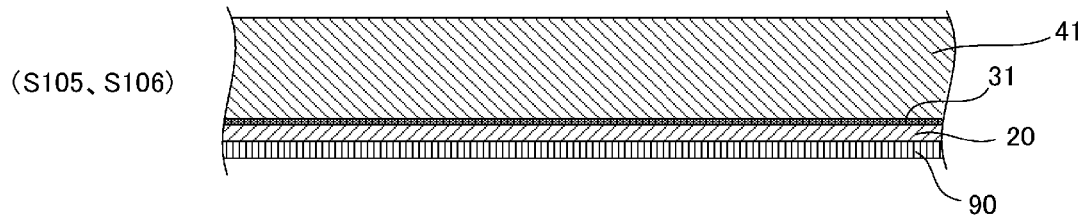

The split surface (i.e., the +C plane 22) of the piezoelectric thin film 20 (single-crystal piezoelectric substrate 1) opposite the −C plane 12 thereof is planarized by polishing (S105 in FIGS. 3 and 5B). The resulting surface roughness is preferably about 0.5 nm or less in terms of arithmetic mean roughness Ra, for example.

A dielectric film 90 is then formed on the split surface of the piezoelectric thin film 20 (S106 in FIGS. 3 and 5B). The dielectric film 90 is deposited on the split surface of the piezoelectric thin film 20 by, for example, evaporation, sputtering, or CVD. The surface of the dielectric film 90 is then planarized, for example, by CMP. The dielectric film 90 is formed of a material having a lower coefficient of linear expansion than the piezoelectric thin film 20 for improved temperature-frequency characteristics of surface acoustic wave devices. For example, the dielectric film 90 is formed of silicon oxide, silicon nitride, silicon oxynitride, a metal oxide, a metal nitride, or diamond-like carbon. A material with good thermal conductivity may be selected as the material for the dielectric film 90 to provide a surface acoustic wave device with a higher power durability.

Figure 5C:
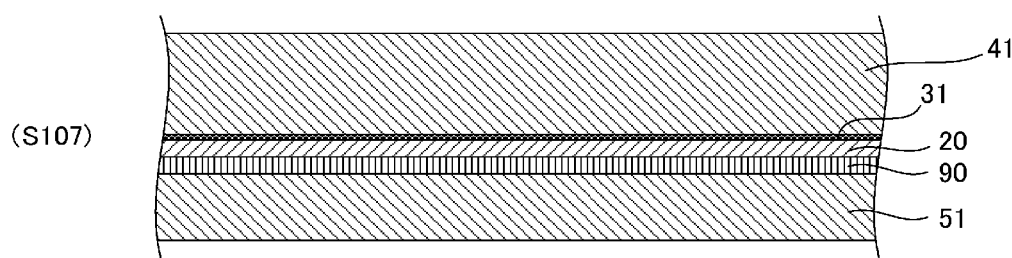

A support-forming step is then performed to form a support 51 on the dielectric film 90 (S107 in FIGS. 3 and 5C). This step may be performed in any manner at the annealing temperature or lower, preferably at the splitting temperature or lower.

The support 51 and the dielectric film 90 constitute a support substrate. Unlike the temporary support substrate described above, materials with any coefficient of linear expansion may be selected for the support substrate including the dielectric film 90 and the support 51 because the thermal stress exerted on the interface with the single-crystal piezoelectric substrate 1 (piezoelectric thin film 20) during a heating step does not have to be considered. Thus, the dielectric film 90 and the support 51 may be formed using materials that themselves have considerably lower coefficients of linear expansion than the piezoelectric thin film 20 to significantly improve the temperature-frequency characteristics of surface acoustic wave devices. In addition, the dielectric film 90 and the support 51 may be formed using materials with good thermal conductivity to improve the heat dissipation and power durability of surface acoustic wave devices. Furthermore, the dielectric film 90 and the support 51 may be formed using inexpensive materials and methods to reduce the manufacturing costs of surface acoustic wave devices.

Figure 5D:
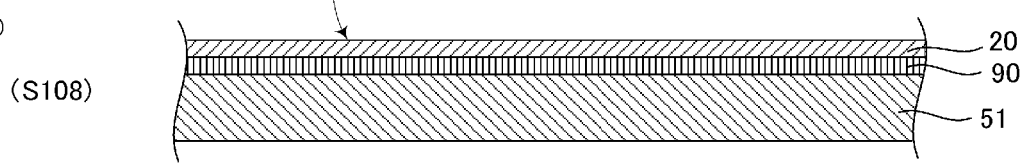

A temporary-support-substrate removing step is then performed to remove the temporary support substrate composed of the etching target layer 31 and the temporary support 41 (S108 in FIGS. 3 and 5D). By this step, the support 51 having the single-crystal piezoelectric thin film 20 formed thereon is obtained. In this preferred embodiment, a single-crystal thin film is formed by the ion implantation step and the splitting step, which allows the formation of a thin film having a higher piezoelectricity than a polycrystalline thin film deposited by, for example, sputtering, evaporation, or CVD. This step may be performed in any manner at the annealing temperature or lower, preferably at the splitting temperature or lower.

To remove the temporary support substrate including the etching target layer 31 and the temporary support 41, the etching target layer 31 is wet-etched or dry-etched. Generally, the etching target layer 31 is wet-etched if the etching target layer 31 is formed of an inorganic material or a metal material, and is dry-etched if the etching target layer 31 is formed of an organic material. This allows the etching target layer 31 and the temporary support 41 to be removed without exerting an undesirable stress or impact on the piezoelectric thin film 20, thus preventing defects in the piezoelectric thin film 20. It is preferable to reuse the temporary support 41 removed from the etching target layer 31 in the manufacture of surface acoustic wave devices later.

The −C plane 12 on the −Z axis side of the piezoelectric thin film 20 shown at S108 in FIG. 5D is then etched (S109 in FIG. 3). Thus, the −Z planes 21 of the piezoelectric thin film 20 on which epitaxial growth is possible are exposed. In this preferred embodiment, the −C plane 12 of the piezoelectric thin film 20 is wet-etched by dipping in an etchant. The etchant is at least one etchant selected from phosphoric acid, pyrophosphoric acid, benzoic acid, octanoic acid, hydrochloric acid, nitric acid, sulfuric acid, hydrofluoric acid, buffered hydrofluoric acid (BHF), and potassium hydrogen sulfate. After etching is complete, as shown in FIG. 6A, an extremely fine stepped structure having flat surfaces formed by the −Z planes 21 of the piezoelectric thin film 20 is exposed in the surface of the piezoelectric thin film 20. Such a stepped structure is formed because the etching rate in the −Z planes 21 is extremely lower than the etching rate in the −Y axis direction.

The etching rate in the −Y axis direction of the piezoelectric thin film 20 is extremely higher than the etching rate in the +Y axis direction of the piezoelectric thin film 20. For example, experiments have demonstrated that the etching rate in the −Y axis direction of the piezoelectric thin film 20 is 2 to 100 times the etching rate in the +Y axis direction of the piezoelectric thin film 20. This allows for a significant reduction in the etchant concentration or etching time for exposing the −Z planes 21 of the piezoelectric thin film 20 on which epitaxial growth is possible. Thus, if the dielectric film is provided between the piezoelectric thin film 20 and the support 51, the amount of dielectric film 90 etched by the etchant can be significantly reduced.

Figure 7A:
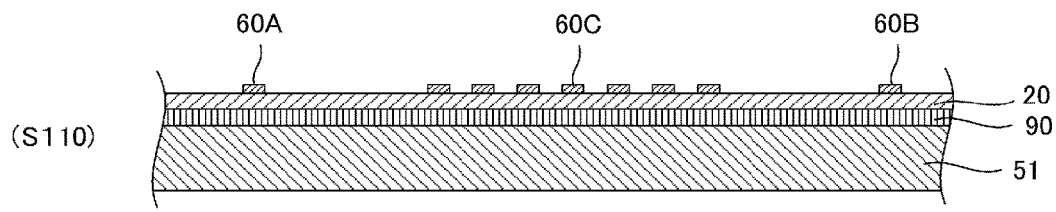
FIGS. 7A to 7C are sectional views schematically showing the process for manufacturing a piezoelectric device shown in FIG. 3.

Upper electrodes 60A and 60B and interdigital transducer (IDT) electrodes 60C having a predetermined thickness are then formed on the surface of the piezoelectric thin film 20 (S110 in FIGS. 3, 6B, and 7A). The electrodes 60A, 60B, and 60C preferably include an Al electrode 66 and an underlying electrode 65 for improving the crystallinity of the Al electrode 66. The underlying electrode 65 is formed of, for example, Ti.

Specifically, at S110, for example, Ti is initially epitaxially grown on the −Z planes 21 of the piezoelectric thin film 20 in the −Z axis direction such that the (001) crystal growth plane thereof is parallel to the −Z planes 21 of the piezoelectric thin film 20. Al is then epitaxially grown on the surface of the Ti electrode 65 in the −Z axis direction such that the (111) crystal growth plane thereof is parallel to the −Z planes 21 of the piezoelectric thin film 20 and the (001) crystal plane of Ti. Thus, as shown in FIG. 6B, an Al electrode 66 whose crystal orientation is aligned in the −Z axis direction of the piezoelectric thin film 20 is formed on the piezoelectric thin film 20. This allows the formation of an Al electrode 66 with superior power durability on the piezoelectric thin film 20.

Thus, the method of manufacture according to this preferred embodiment allows for an improvement in the power durability of an Al electrode and a significant reduction in etchant concentration or etching time.

Figure 7B:
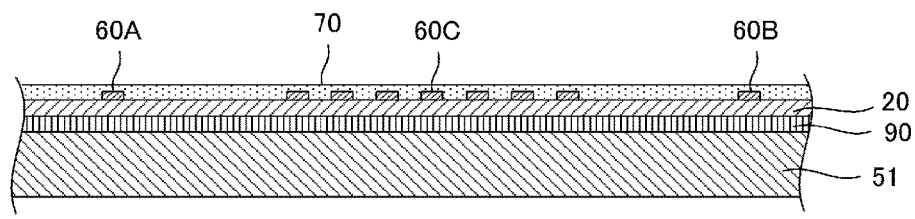

An insulating film 70 is then formed on the surfaces of the piezoelectric thin film 20 and the electrodes 60A to 60C to protect the piezoelectric thin film 20 and the electrodes 60A to 60C (S111 in FIGS. 3 and 7B). The insulating film 70 is formed of, for example, $SiO_2$.

Figure 7C:
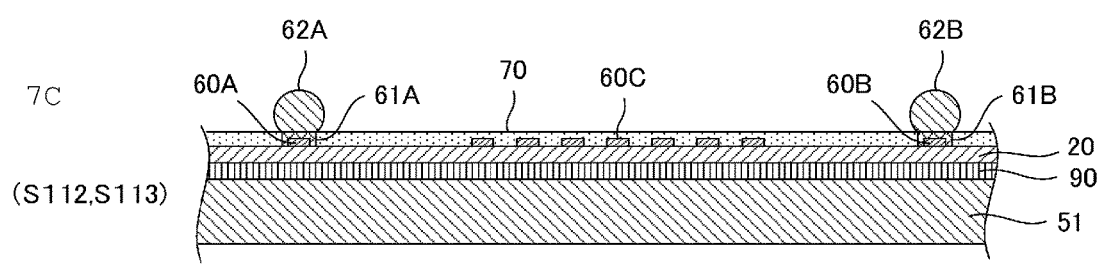

Openings (not shown) are then formed in the regions of the insulating film 70 where the upper electrodes 60A and 60B are to be exposed, for example, by etching (S112 in FIGS. 3 and 7C). Thereafter, bump pads 61A and 61B are formed on the upper electrodes 60A and 60B, respectively, and bumps 62A and 62B are formed on the bump pads 61A and 61B, respectively (S113 in FIGS. 3 and 7C).

Finally, a separating step is performed to separate a plurality of piezoelectric devices formed on the support substrate, followed by packaging using a mold. In this manner, a plurality of piezoelectric devices are simultaneously manufactured.

As shown at S113 in FIGS. 6A, 6B, and 7C, the piezoelectric device manufactured by the above method of manufacture includes the support 51, the dielectric film 90 formed on the support 51, the piezoelectric thin film 20 formed on the dielectric film 90 and polarized along the +Z axis and the −Z axis, which are crystal axes, and the electrodes 60A to 60C formed on the −Z planes 21 of the piezoelectric thin film 20 perpendicular to the −Z axis and having a (111) crystal plane of aluminum parallel to the −Z planes 21 of the piezoelectric thin film 20.

The electrodes 60A to 60C in this structure have superior power durability because the crystal orientation thereof is aligned in the −Z axis direction. In this piezoelectric device structure, during manufacture, the −Z planes 21 of the piezoelectric thin film 20 on which epitaxial growth is possible are exposed by etching the −C plane 12 on the −Z axis side of the piezoelectric thin film 20. As described above, this allows for a significant reduction in etchant concentration or etching time. Thus, if the dielectric film 90 is provided between the piezoelectric thin film 20 and the support 51, the amount of dielectric film 90 etched by the etchant is significantly reduced.

Thus, the piezoelectric device according to this preferred embodiment improves the power durability of the Al electrode 66 and a significant reduction in etchant concentration or etching time during manufacture.

Next, an example of a method for manufacturing a piezoelectric device according to a second preferred embodiment of the present invention will be described with reference to the drawings. As the method for manufacturing a piezoelectric device, a method for manufacturing a surface acoustic wave device will be described below by way of example.

The second preferred embodiment differs from the first preferred embodiment in that no preliminary support is formed and is preferably the same or substantially the same as the first preferred embodiment in the etching and subsequent steps.

Figure 8:
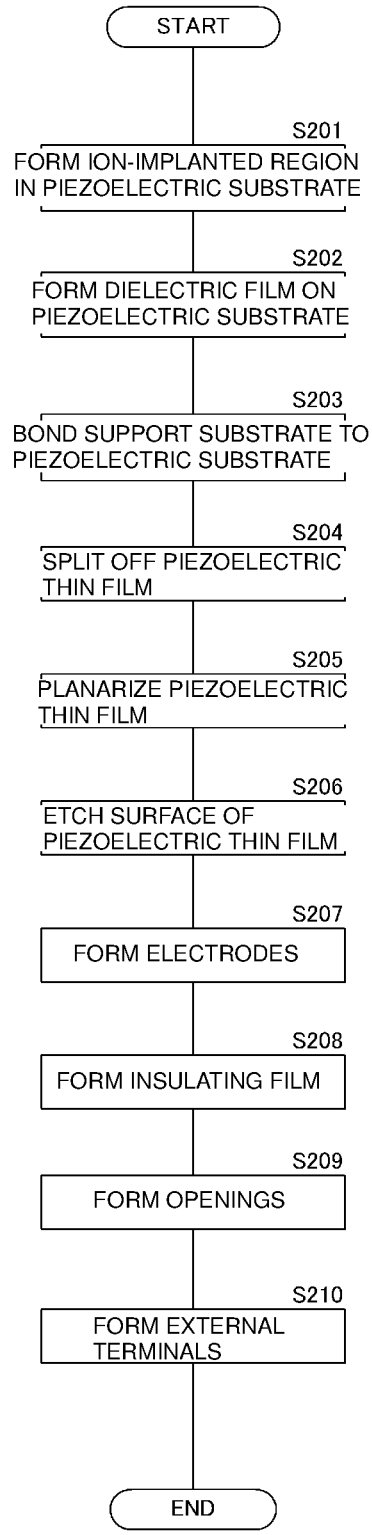
FIG. 8 is a flowchart showing an example of a method for manufacturing a piezoelectric device according to a second preferred embodiment of the present invention.
Figure 10A:
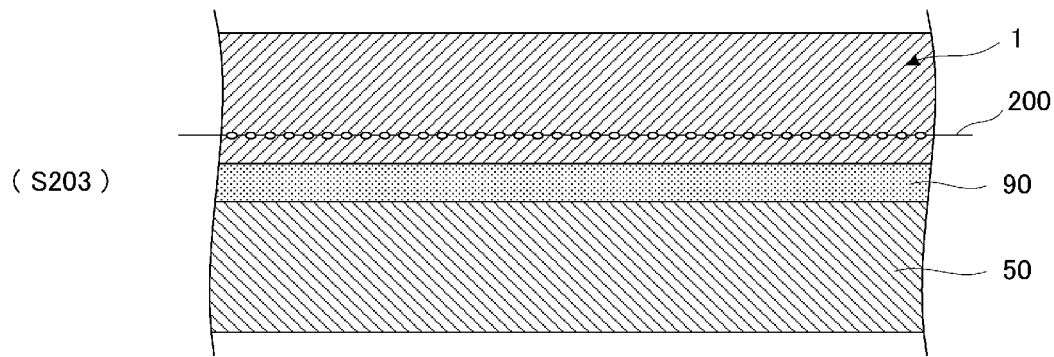
FIGS. 10A and 10B are sectional views schematically showing the process for manufacturing a piezoelectric device shown in FIG. 8.
Figure 10B:
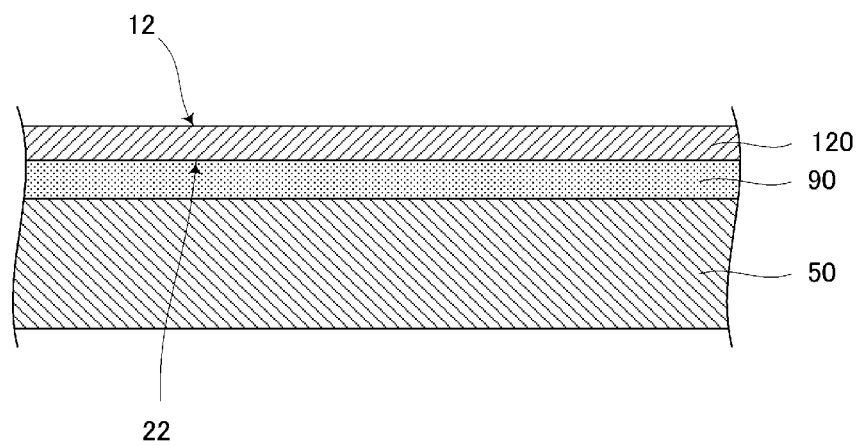
Figure 11A:
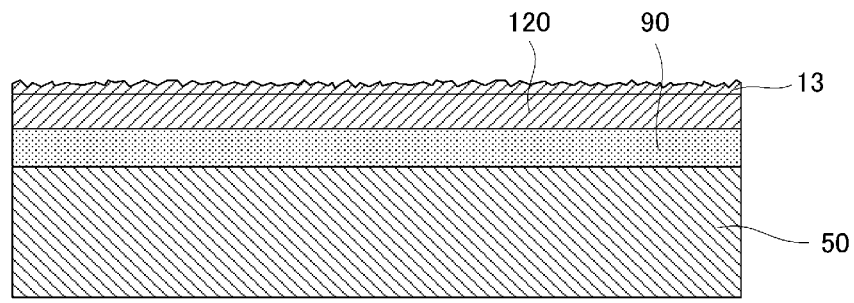
FIG. 11A is a sectional view schematically showing a split surface of a piezoelectric thin film 120 shown at S204 in FIG. 10.
Figure 11B:
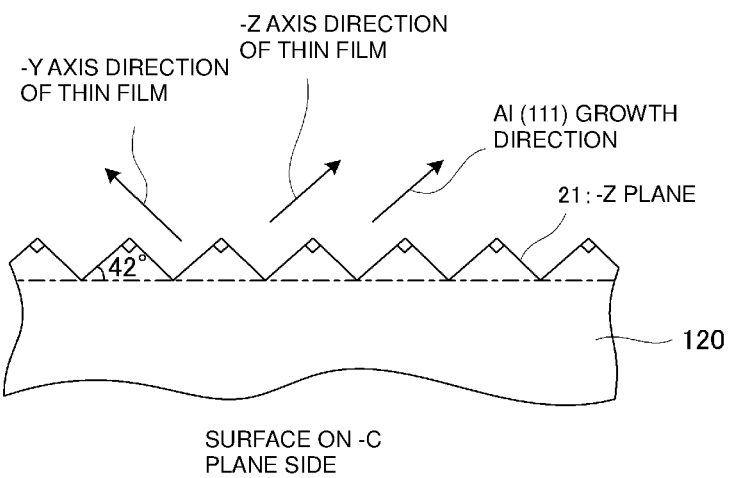
FIG. 11B a sectional view schematically showing a stepped structure on the −C plane side of the piezoelectric thin film 120 exposed after the completion of an etching step shown at S206 in FIG. 8.
Figure 11C:
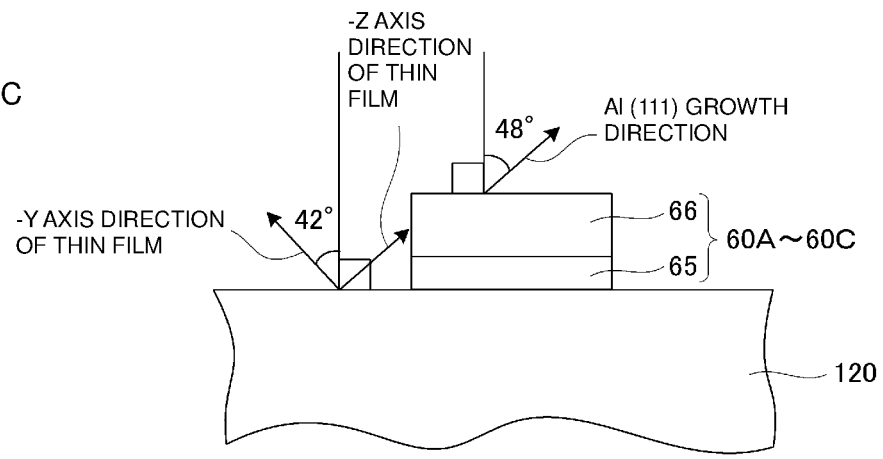
FIG. 11C a sectional view schematically showing electrodes 60A to 60C epitaxially grown on −Z planes of the piezoelectric thin film 120 by an electrode-forming step shown at S207 in FIG. 8.

FIG. 8 is a flowchart showing the method for manufacturing a piezoelectric device according to the second preferred embodiment. FIGS. 9A, 9B, 10A, 10B, and 12A-12C are sectional views schematically showing the process for manufacturing a piezoelectric device according to the second preferred embodiment. FIG. 11A is a sectional view schematically showing a split surface of a piezoelectric thin film 120 shown at S204 in FIG. 10B. FIG. 11B is a sectional view schematically showing a stepped structure on the −C plane side of the piezoelectric thin film 120 exposed after the completion of an etching step shown at S206 in FIG. 8. FIG. 11C is a sectional view schematically showing electrodes 60A to 60C epitaxially grown on −Z planes of the piezoelectric thin film 120 by an electrode-forming step shown at S207 in FIGS. 8 and 12A.

The same single-crystal piezoelectric substrate 1 as in the first preferred embodiment is provided first. Also provided is a support substrate 50 having a predetermined thickness, as shown in FIGS. 10A and 10B. The support substrate 50 is a Si substrate. The support substrate 50 is a substrate on which a plurality of piezoelectric devices are to be arranged. Instead of a Si substrate, the support substrate 50 may be, for example, a ceramic substrate such as a glass substrate, a quartz substrate, or a sapphire substrate. More preferably, the support substrate is formed of the same material as the single-crystal piezoelectric substrate 1 so that they have the same coefficient of linear expansion.

Figure 9A:
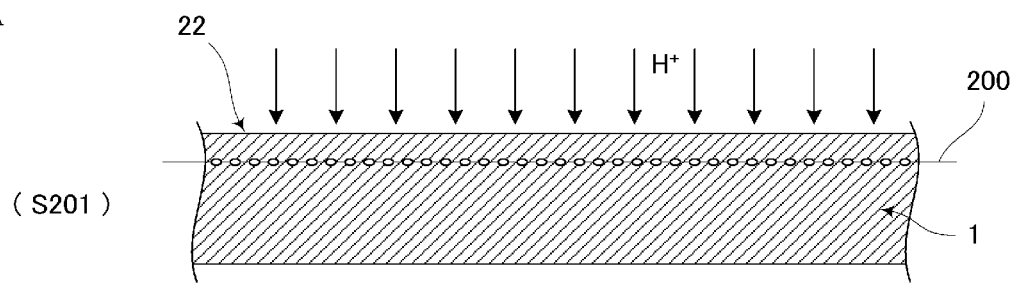
FIGS. 9A and 9B are sectional views schematically showing the process for manufacturing a piezoelectric device shown in FIG. 8.

Hydrogen ions are then implanted into the +C plane 22 of the single-crystal piezoelectric substrate 1 to form an ion-implanted region 200 in the single-crystal piezoelectric substrate 1 (S201 in FIGS. 8 and 9A). For example, if the single-crystal piezoelectric substrate 1 is a lithium tantalate substrate, hydrogen ions are implanted at a dose of about $1.0 \times 10^{17}$ atoms/cm$^2$ with an acceleration energy of about 150 keV to form the ion-implanted region 200 at a depth of about 1 μm from the +C plane 22. The ion-implanted region 200 is a region in which the concentration of the ion element implanted into the single-crystal piezoelectric substrate 1 peaks.

Figure 9B:
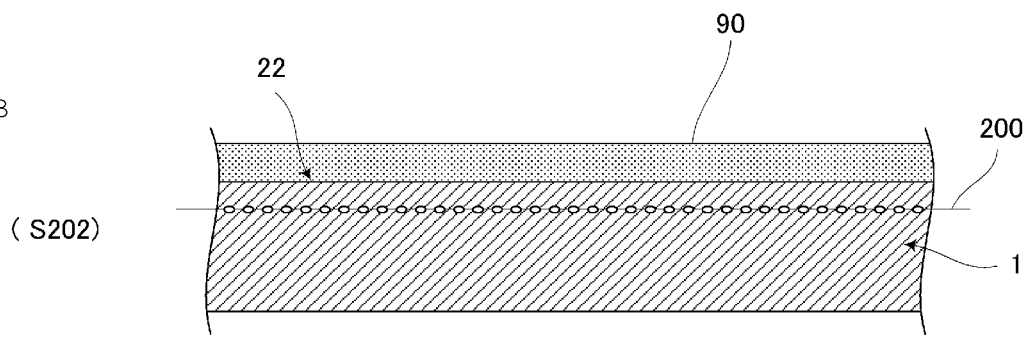

A dielectric film 90 is then formed on the +C plane 22 of the single-crystal piezoelectric substrate 1 (S202 in FIGS. 8 and 9B). The dielectric film 90 is deposited on the +C plane 22 of the single-crystal piezoelectric substrate 1 by, for example, evaporation, sputtering, or CVD. The surface of the dielectric film 90 is then planarized, for example, by CMP.

The support substrate 50 is then bonded to the single-crystal piezoelectric substrate 1 (S203 in FIGS. 8 and 10A). The support substrate 50 corresponds to a "support".

This bonding can be performed by direct bonding such as activation bonding or hydrophilic bonding or by bonding using interdiffusion through a metal layer. Although the support substrate 50 is bonded to the single-crystal piezoelectric substrate 1 in this preferred embodiment, the support substrate 50 may in practice be formed on the single-crystal piezoelectric substrate 1, for example, by deposition.

The stack of the single-crystal piezoelectric substrate 1 and the support substrate 50 is then heated (to about 500° C. in this preferred embodiment) to split the single-crystal piezoelectric substrate 1 along the ion-implanted region 200 (S204 in FIGS. 8 and 10B). The heating temperature in the splitting step at S204 can be lowered if the stack of the single-crystal piezoelectric substrate 1 and the support substrate 50 is heated in a reduced-pressure atmosphere.

By the splitting step at S204, a single-crystal piezoelectric thin film 120 is formed on the support substrate 50. The surface in which ions are implanted for the piezoelectric thin film 120 formed in the second preferred embodiment, i.e., the +C plane 22, is opposite the surface in which ions are implanted for the piezoelectric thin film 20 in the first preferred embodiment, i.e., the −C plane 12 (see FIGS. 4A-4C and 5A-5D). In this preferred embodiment, additionally, a single-crystal thin film is formed by ion implantation and splitting, which allows the formation of a thin film having a higher piezoelectricity than a polycrystalline thin film deposited by, for example, sputtering, evaporation, or CVD.

The split surface (i.e., the −C plane 12) of the piezoelectric thin film 120 is then planarized by polishing such as CMP (S205 in FIGS. 8 and 10B). The resulting surface roughness is preferably about 0.5 nm or less in terms of arithmetic mean roughness Ra, for example.

The −C plane 12 on the −Z axis side of the piezoelectric thin film 120 is then etched (S206 in FIGS. 8 and 11A). The etching process used in this preferred embodiment is preferably the same as in the first preferred embodiment. Thus, a several-nm-thick damaged layer 13 (see FIG. 11A) formed on the surface of the piezoelectric thin film 120 by, for example, polishing is removed to expose −Z planes 21 of the piezoelectric thin film 120 on which epitaxial growth is possible. After etching is complete, as shown in FIG. 11B, an extremely fine stepped structure having flat surfaces formed by the −Z planes 21 of the piezoelectric thin film 120 is exposed in the surface of the piezoelectric thin film 120, as in the first preferred embodiment.

As described above, the etching rate in the −Y axis direction of the piezoelectric thin film 120 is extremely higher than the etching rate in the +Y axis direction of the piezoelectric thin film 120. This allows for a significant reduction in the etchant concentration or etching time for exposing the −Z planes 21 of the piezoelectric thin film 120 on which epitaxial growth is possible. Thus, if the dielectric film 90 is provided between the piezoelectric thin film 120 and the support 51, the amount of dielectric film 90 etched by the etchant can be significantly reduced.

Figure 12A:
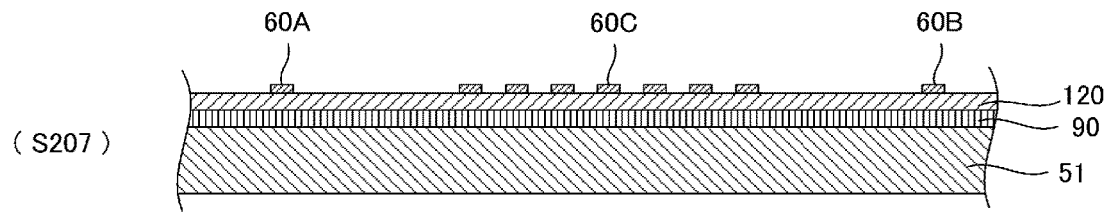
FIGS. 12A to 12C are sectional views schematically showing the process for manufacturing a piezoelectric device shown in FIG. 8.
Figure 12B:
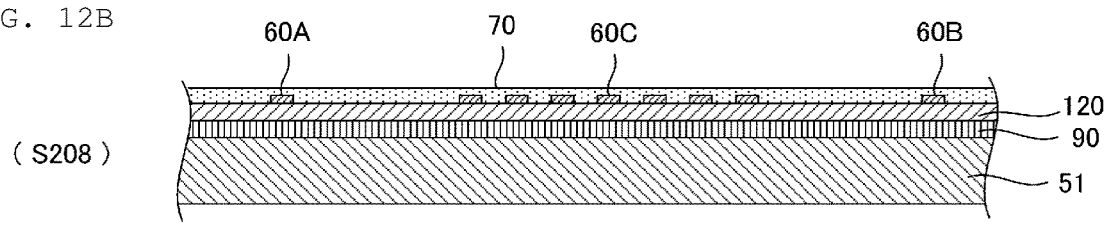
Figure 12C:
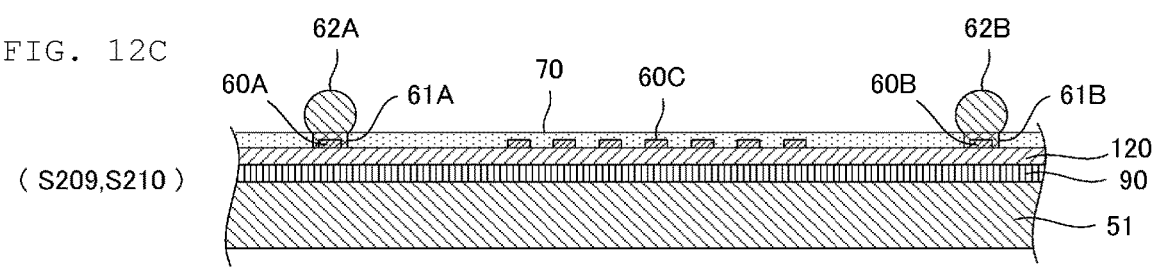

Upper electrodes 60A and 60B and interdigital transducer (IDT) electrodes 60C having a predetermined thickness are then formed on the surface of the piezoelectric thin film 120 (S207 in FIGS. 8, 11C, and 12A). Specifically, at S207, for example, Ti is initially epitaxially grown on the −Z planes 21 of the piezoelectric thin film 120 in the −Z axis direction such that the (001) crystal growth plane thereof is parallel to the −Z planes 21 of the piezoelectric thin film 120. Al is then epitaxially grown on the surface of the Ti electrode 65 in the −Z axis direction such that the (111) crystal growth plane thereof is parallel to the −Z planes 21 of the piezoelectric thin film 120 and the (001) crystal plane of Ti. Thus, as shown in FIG. 11C, an Al electrode 66 whose crystal orientation is aligned in the −Z axis direction of the piezoelectric thin film 120 is formed on the piezoelectric thin film 120. This allows the formation of an Al electrode 66 with superior power durability on the piezoelectric thin film 120.

Thus, the method of manufacture according to this preferred embodiment provides the same advantages as the method of manufacture according to the first preferred embodiment.

Finally, as in the method for manufacturing a piezoelectric device according to the first preferred embodiment, other steps such as forming external terminals (S208 to S210 in FIGS. 8, 12B, and 12C) are performed, followed by a separating step and a molding step. Thus, a surface acoustic wave device is obtained. The two sides of the piezoelectric thin film in this surface acoustic wave device are reversed with respect to the two sides of the piezoelectric thin film in the surface acoustic wave device manufactured in the first preferred embodiment.

As shown at S210 in FIGS. 11A-11C and 12C, the piezoelectric device manufactured by the above method of manufacture includes the support substrate 50, the dielectric film 90 formed on the support substrate 50, the piezoelectric thin film 120 formed on the dielectric film 90 and polarized along the +Z axis and the −Z axis, which are crystal axes, and the electrodes 60A to 60C formed on the −Z planes 21 of the piezoelectric thin film 120 perpendicular to the −Z axis and having a (111) crystal plane of aluminum parallel to the −Z planes 21 of the piezoelectric thin film 120. That is, the piezoelectric device manufactured in the second preferred embodiment preferably has the same structure as the piezoelectric device manufactured in the first preferred embodiment. Thus, the piezoelectric device according to this preferred embodiment provides the same advantages as the piezoelectric device according to the first preferred embodiment.

Although the above preferred embodiments illustrate surface acoustic wave devices, the present invention is also applicable to boundary acoustic wave devices, for example. In addition, the present invention is applicable to various other devices based on a single-crystal piezoelectric thin film and including a membrane, including bulk wave devices, gyroscopes, RF switches, and vibration-type energy generators, for example.

Although the single-crystal piezoelectric substrate 1 used in the above preferred embodiments preferably is a 42° Y-X cut lithium tantalate substrate, the present invention is also effective for substrates having different cut angles because the −Z planes 21 on which epitaxial growth is possible can be exposed by an etching process. The same advantages are also provided for lithium niobate substrates, which have a quite similar crystal structure. Piezoelectric substrates other than lithium tantalate substrates and lithium niobate substrates can also be used, for example.

Although Al is preferably used as the material for the electrode 66 in the above preferred embodiments, Al alloys containing extremely small amounts of additives that improve the power durability, such as Cu, Mg, Ni, and Mo, may in practice be used instead, for example. Likewise, although Ti is used as the material for the underlying electrode layer 65, Ti-based alloys may be used instead, for example. Cr, Cr-based alloys, and other metals effective in improving the crystallinity of Al may also be used.

Although wet etching with a strong acid preferably is used in the above preferred embodiments, other methods may in practice be used instead, including chemical mechanical polishing and scrubber cleaning, for example.

Thus, the description of the above preferred embodiments is illustrative in all aspects and should not be construed as limiting. The scope of the present invention is defined by the claims, rather than by the above preferred embodiments. All modifications within the meaning and range of equivalents of the claims are intended to be included within the scope of the present invention.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A method for manufacturing a piezoelectric device including a support and a piezoelectric thin film formed on or over the support, polarized along a +Z axis and a −Z axis that are crystal axes, and including a +C plane and a C plane, the +C plane being a first main surface on a side of the +Z axis of the piezoelectric thin film, and the C plane being a second main surface on a side of the −Z axis of the piezoelectric thin film, the method comprising:

a dielectric film-forming step of, among the +C plane and the −C plane, forming a dielectric film on the +C plane of the piezoelectric thin film;

a support-forming step of forming a support on the dielectric film;

an etching step of, among the +C plane and the −C plane, etching the −C plane; and an electrode-forming step of forming an electrode by epitaxially growing an electrode material on a crystal plane, exposed by the etching, of the piezoelectric thin film perpendicular to the −Z axis in the −Z axis direction such that a crystal growth plane thereof is parallel to the crystal plane of the piezoelectric thin film.

2. The method for manufacturing a piezoelectric device according to claim 1, wherein the electrode material is aluminum or an aluminum-based material.

3. The method for manufacturing a piezoelectric device according to claim 2, wherein the electrode is formed in the electrode-forming step by epitaxially growing the aluminum on the crystal plane of the piezoelectric thin film in the −Z axis direction such that a (111) crystal growth plane of the aluminum is parallel to the crystal plane of the piezoelectric thin film.

4. The method for manufacturing a piezoelectric device according to claim 3, wherein the piezoelectric thin film comprises single-crystal lithium niobate or single-crystal lithium tantalate.

5. The method for manufacturing a piezoelectric device according to claim 2, wherein the piezoelectric thin film comprises single-crystal lithium niobate or single-crystal lithium tantalate.

6. The method for manufacturing a piezoelectric device according to claim 1, wherein the piezoelectric thin film comprises single-crystal lithium niobate or single-crystal lithium tantalate.

7. The method for manufacturing a piezoelectric device according to claim 1, further comprising:

an ion implantation step of implanting an ionized element into a single-crystal piezoelectric substrate to form a region in which a concentration of the element implanted into the single-crystal piezoelectric substrate peaks; and a splitting step of splitting off the piezoelectric thin film from the single-crystal piezoelectric substrate along the region in which the concentration of the implanted element peaks.

8. The method for manufacturing a piezoelectric device according to claim 7, wherein the single-crystal piezoelectric substrate is a rotated Y-cut substrate.

* * * * *